United States Patent [19]
Delker

[11] Patent Number: 5,349,554
[45] Date of Patent: Sep. 20, 1994

[54] MEMORY ELEMENT WITH BIPOLAR TRANSISTORS IN RESETTABLE LATCH

[75] Inventor: Klaus Delker, Munich, Fed. Rep. of Germany

[73] Assignee: Siemens Aktiengesellschaft, Munich, Fed. Rep. of Germany

[21] Appl. No.: 123,524

[22] Filed: Sep. 17, 1993

[30] Foreign Application Priority Data

Sep. 17, 1992 [DE] Fed. Rep. of Germany ....... 4231178

[51] Int. Cl.[5] .............................................. G11C 11/40
[52] U.S. Cl. ............................. 365/189.05; 365/154; 365/190; 365/208; 365/233; 307/530
[58] Field of Search .................... 365/154, 189.05, 190, 365/208, 233; 307/530

[56] References Cited

U.S. PATENT DOCUMENTS

| | | | |
|---|---|---|---|
| 4,506,171 | 3/1985 | Evans et al. | 307/530 |
| 4,599,526 | 7/1986 | Paski | 307/530 |
| 4,982,119 | 1/1991 | Tateishi | 307/530 |
| 5,206,550 | 4/1993 | Mehta | 365/208 |

Primary Examiner—Joseph E. Clawson, Jr.
Attorney, Agent, or Firm—Herbert L. Lerner; Laurence A. Greenberg

[57] ABSTRACT

The invention relates to a memory element in current circuit technology having a first, a second and a third transistor pair each with emitter coupled transistors. Each of the second and third transistor pairs is connected in the collector circuit of a respective one of the transistors of the first transistor pair. Connected in each of the pairwise coupled collector circuits of the transistors of the second and third transistor pairs are a first resistor, the collector-to-emitter path of a further transistor with an output signal terminal disposed on the collector side and a second resistor. The collector of one transistor of a fourth transistor pair connected as a current switch is connected with the base of one of the further transistors. The setting and resetting of the memory element is made possible by the fourth transistor pair without increasing the capacitive load on the signal path of the memory element.

5 Claims, 1 Drawing Sheet

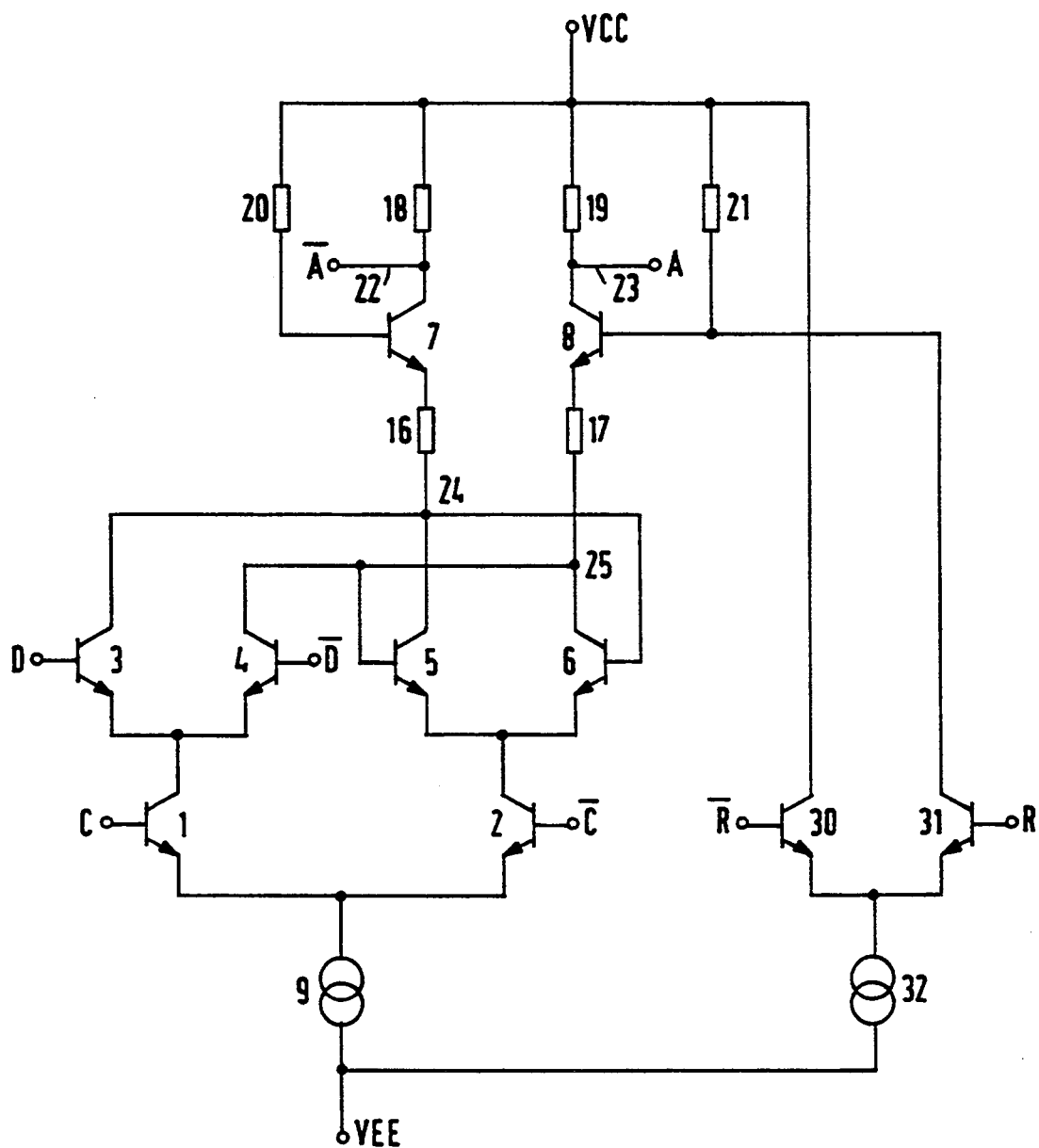

MEMORY ELEMENT WITH BIPOLAR TRANSISTORS IN RESETTABLE LATCH

BACKGROUND OF THE INVENTION

Field of the Invention

The invention relates to a memory element having the following characteristics:

(a) the emitters of first and second transistors of a first transistor pair are coupled and are connected through a current source to a terminal for a first supply potential;

(b) the collector of the first transistor of the first transistor pair is connected to the coupled emitters of first and second transistors of a second transistor pair;

(c) the collector of the second transistor of the first transistor pair is connected to the coupled emitters of first and second transistors of a third transistor pair;

(d) the collectors of the transistors of the second and third transistor pairs are coupled in pairs and each connected to a first terminal of a respective resistor;

(e) a second terminal of each resistor is connected through the collector-to-emitter path of one respective transistor of a fourth transistor pair to a second supply potential;

(f) the transistors of the fourth transistor pair are connected as an emitter follower circuit with respect to the second supply potential;

(g) the collector of at least one of the transistors of the fourth transistor pair is connected to an output signal terminal and through a resistor to the terminal for the second supply potential;

(h) the base of the first transistor of the third transistor pair is connected to the collector of the second transistor of the third transistor pair;

(i) the base terminals of the first transistors of the first and second transistor pairs are each terminals for a respective input signal; and (j) the base terminals of the second transistors of the first, second and third transistor pairs are each terminals for a respective reference signal.

Such memory elements are preferably used in digital circuits that operate at a high clock frequency. The maximum possible operating speed of the memory element is determined substantially by the capacitive load that is applied to the paired coupled collectors of the transistors of the second and third transistor pairs. Such capacitances are composed primarily of the capacitance between the metallizing and the substrate of connecting lines, with which the components connected to a circuit node are connected, and the capacitance between the collectors and the substrate of the connecting transistors.

Heretofore, one transistor each has been used for setting and for resetting the memory element, and its collector-to-emitter path has been connected between the base terminal of one of the transistors of the third transistor pair and the coupled emitter terminals of those transistors. Since the base terminal of each transistor of the third transistor pair is connected crosswise to the collector terminal of the respectively other transistor, the capacitive load at the collectors of the transistors of the third transistor pair becomes even higher through one additional transistor for setting or resetting the memory element. Therefore, the maximum attainable operating speed is reduced.

SUMMARY OF THE INVENTION

It is accordingly an object of the invention to provide a memory element, which overcomes the hereinafore-mentioned disadvantages of the heretofore-known devices of this general type and which has a setting or resetting function by which the switching speed of the memory element is unaffected.

With the foregoing and other objects in view there is provided, in accordance with the invention, a memory element, comprising a first transistor pair having first and second transistors with bases, collectors and coupled emitters, and a current source connecting the coupled emitters to a terminal for a first supply potential; a second transistor pair having first and second transistors with bases, collectors and coupled emitters, the collector of the first transistor of the first transistor pair being connected to the coupled emitters of the first and second transistors of the second transistor pair; a third transistor pair having first and second transistors with bases, collectors and coupled emitters, the collector of the second transistor of the first transistor pair being connected to the coupled emitters of the first and second transistors of the third transistor pair; resistors having first and second terminals, the collectors of one of the transistors of each of the second and third transistor pairs being coupled together and connected to the first terminal of one of the resistors, and the collectors of the other of the transistors of each of the second and third transistor pairs being coupled together and connected to the first terminal of the other of the resistors; a fourth transistor pair having first and second transistors with bases and with collectors and emitters defining collector-to-emitter paths, the second terminals of the resistors each being connected through the collector-to-emitter path of a respective one of the transistors of the fourth transistor pair to a terminal for a second supply potential; the transistors of the fourth transistor pair being connected as an emitter follower circuit with respect to the second supply potential; the collector of at least one of the transistors of the fourth transistor pair being connected to an output signal terminal, and at least one other resistor connecting the collector of the at least one transistor of the fourth transistor pair to the terminal for the second supply potential; the base of the first transistor of the third transistor pair being connected to the collector of the second transistor of the third transistor pair; the bases of the first transistors of the first and second transistor pairs each being a terminal for a respective input signal; the bases of the second transistors of the first, second and third transistor pairs each being a terminal for a respective reference signal; a fifth transistor pair having first and second transistors with bases, collectors and coupled emitters, and another current source connecting the coupled emitters of the first and second transistors of the fifth transistor pair to the terminal for the first supply potential; the collector of the first transistor of the fifth transistor pair being connected to the base of one of the transistors of the fourth transistor pair; the collector of the second transistor of the fifth transistor pair being connected to the terminal for the second supply potential; and the base of one of the transistors of the fifth transistor pair being a terminal for an input signal, and the base of the other of the transistors of the fifth transistor pair being a terminal for a reference signal.

In accordance with another feature of the invention, the reference signals are fixed potentials.

In accordance with a further feature of the invention, the reference signals at the second transistors of the first and second transistor pairs are input signals being complementary to the input signals at the bases of the first transistors of the first and second transistor pairs.

In accordance with an added feature of the invention, the base of the second transistor of the third transistor pair is connected to the collector of the first transistor of the third transistor pair.

In accordance with a concomitant feature of the invention, the reference signal at the fifth transistor pair is a signal complementary to the input signal at the fifth transistor pair.

Other features which are considered as characteristic for the invention are set forth in the appended claims.

Although the invention is illustrated and described herein as embodied in a memory element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The figure is a schematic circuit diagram of a memory element according to the invention.

DESCRIPTION OF THE PREFERRED EMBODIMENTS

Referring now to the single figure of the drawing in detail, there is seen a memory element of the invention which includes a first transistor pair having first and second bipolar transistors 1, 2, with emitters that are connected to one another and are connected through a current source 9 to a terminal for a first supply potential VEE. Coupled emitters of transistors of second and third transistor pairs which are first and second transistors 3, 4 on one hand and first and second transistors 5, 6 on the other hand, are each connected to a collector of a respective one of the transistors 1, 2. Collectors of the transistors of the further transistor pairs are coupled in pairs. As the drawing shows, the collectors of the transistors 3, 5 are connected to make a node 24, and the collectors of the transistors 4, 6 are connected to make a node 25. The nodes 24, 25 are each connected through a series circuit of a respective resistor 16 and 17 and a collector-to-emitter path of a respective first or second transistor 7 and 8 of a fourth transistor pair, to a terminal for a second supply potential VCC. One other resistor 18, 19 is incorporated into the collector circuit of each respective one of the transistors 7, 8. Terminals of the resistors 18, 19 on the collector side each have a respective terminal 22 and 23 for an output signal $\overline{A}$ and A. Base terminals of the transistors 7, 8 are each made conducting through a respective resistor 20 and 21 which is connected to the terminal for the supply potential VCC. Base terminals of the transistors 1, 2 are each connected to a terminal for a respective complementary signal C and $\overline{C}$. The signal C is typically the clock signal of the memory element. Base terminals of the transistors 3, 4 are terminals for respective data signals D and $\overline{D}$ that are complementary to one another. Base terminals of the transistors 5, 6 are each fed back crosswise to the collector of a respective one of the transistors 6, 5, or in other words to a respective one of the circuit nodes 25, 24.

A device for resetting the memory element is provided in the form of a current switch having first and second transistors 31, 30 of a fifth transistor pair with coupled emitters which are connected through a current source 32 to the terminal for the supply potential VEE. A collector of the transistor 30 is connected to the terminal for the supply potential VCC, and a collector of the transistor 31 is connected to the base of the transistor 8. Base terminals of the transistors 31, 30 are each controlled by a respective complementary reset signal R, $\overline{R}$.

The mode of operation of the memory element will be described below. During an H phase of the clock signal C, the transistor 1 conducts and the transistor 2 blocks. If the data signal D is H, for instance, then the transistor 3 conducts and the transistor 4 blocks. The current impressed by the current source 9 then flows over the path of the transistors 3, 1 and over the path of the resistors 16, 18 and the transistor 7. The resistor 18 is dimensioned in such a way that the level of the output signal $\overline{A}$ at the output 22 is an L level. The resistor 19 is without current, so that the output signal A at the output 23 is H. The output signal $\overline{A}$ is accordingly complementary to, but the output signal A is in the same direction as, the data signal D. If the clock signal C switches over to L, then the current of the current source 9 flows through the transistor 2 and the current switch having the transistors 5, 6. Due to the crosswise feedback of the base terminals of the transistors 5, 6 to their corresponding collector terminals, the transistor 5 becomes conducting and the transistor 6 blocks. The levels A, $\overline{A}$ are stored in memory and can now no longer be affected by the data signal.

The transistors 7, 8 are connected as an emitter follower circuit with respect to the supply potential VCC. Consequently, the potential at the emitters of the transistors 7, 8 is constant and is composed of the voltage drop at the resistors 20 and 21 and the base-to-emitter voltages of the transistors 7 and 8, respectively. The signals A and $\overline{A}$ are decoupled from the corresponding signals at the circuit nodes 25 and 24 by the transistors 7, 8. Through the use of the inductive behavior of the transistors 7, 8 with respect to the signals at the nodes 24 and 25, the parasitic capacitive loads at these circuit nodes are compensated for. The inductance of the transistors 7, 8 can be adjusted through the respective resistors 20, 21.

Assuming the reset signal R is initially L, the transistor 31 is then blocked, so that the base potential of the transistor 8 is unaffected thereby, and the switching state of the memory element stays the same. If the reset signal R is set to H, the transistor 31 is conducting and the transistor 30 blocks. As a result, the potential at the base of the transistor 8 is lowered, so that since the clock signal C is L, the current switch of the transistors 5, 6 switches over. Due to its base potential which is then low, the transistor 5 is blocked and the transistor 6 is conducting. The output signal A switches over to L. The memory element is accordingly reset by an H level of the reset signal R.

In order to provide the memory element with a setting function, it is necessary to provide a current switch corresponding to the current switch having the transistors 30 and 31 and the current source 32, in which the collector terminal of one of the transistors is connected to the base terminal of the transistor 7. If this transistor is made conducting, then the base potential at the transistor 7 is lowered so far that the transistor 6 blocks and the transistor 5 is conducting. The output signal A is then H. If the memory element is intended to have a setting and resetting function, then one current switch is needed for each function, that is setting and resetting. These current switches are then connected in accordance with the above description.

An advantage of the current switch according to the invention is that the nodes 24, 25 are not additionally capacitively loaded. If they are not active, the additional circuit provisions required for a setting and resetting function have no influence on the signal paths in the memory element. The delay time of the memory element and therefore its maximum operating speed accordingly remain unaffected.

In the case of a memory element according to the invention, other embodiments that are not shown in the drawing are also possible. The inputs of the memory element shown in the drawing are controlled by complementary signals. Correspondingly, the output signal terminals have complementary signals. It is also possible to use only one of the operating resistors 18 or 19 and only one of the corresponding output signal terminals 22 or 23. The collector of one of the transistors 7, 8 is then directly connected to the terminal for the supply potential VCC.

It is also possible to use fixed reference potentials as reference signals for the signals D, C, R, instead of the complementary signals $\overline{D}, \overline{C}, \overline{R}$. The reference potentials are preferentially located in the middle of the signal level rise of the corresponding signals D, C or R.

It is also conceivable for the base of only one of the transistors 5, 6 to be connected to the node 25 or 24. Then the base of the other of the transistors 5, 6 is controlled by a reference potential. The value of this reference potential is preferably located in the middle of the level rise applied to the base of whichever one of the transistors is connected to the node. Typically, the circuit is dimensioned in such a way that these levels correspond to the level values for L and H of the signal D.

I claim:

1. A memory element, comprising:
    (a) a first transistor pair having first and second transistors with bases, collectors and coupled emitters, and a current source connecting the coupled emitters to a terminal for a first supply potential;
    (b) a second transistor pair having first and second transistors with bases, collectors and coupled emitters, the collector of said first transistor of said first transistor pair being connected to the coupled emitters of said first and second transistors of said second transistor pair;
    (c) a third transistor pair having first and second transistors with bases, collectors and coupled emitters, the collector of said second transistor of said first transistor pair being connected to the coupled emitters of said first and second transistors of said third transistor pair;
    (d) resistors having first and second terminals, the collectors of one of said transistors of each of said second and third transistor pairs being coupled together and connected to the first terminal of one of said resistors, and the collectors of the other of said transistors of each of said second and third transistor pairs being coupled together and connected to the first terminal of the other of said resistors;
    (e) a fourth transistor pair having first and second transistors with bases and with collectors and emitters defining collector-to-emitter paths, the second terminals of said resistors each being connected through the collector-to-emitter path of a respective one of said transistors of said fourth transistor pair to a terminal for a second supply potential;
    (f) said transistors of said fourth transistor pair being connected as an emitter follower circuit with respect to the second supply potential;
    (g) the collector of at least one of said transistors of said fourth transistor pair being connected to an output signal terminal, and at least one other resistor connecting the collector of the at least one transistor of said fourth transistor pair to the terminal for the second supply potential;
    (h) the base of said first transistor of said third transistor pair being connected to the collector of said second transistor of said third transistor pair;
    (i) the bases of said first transistors of said first and second transistor pairs each being a terminal for a respective input signal;
    (j) the bases of said second transistors of said first, second and third transistor pairs each being a terminal for a respective reference signal;
    (k) a fifth transistor pair having first and second transistors with bases, collectors and coupled emitters, and another current source connecting the coupled emitters of said first and second transistors of said fifth transistor pair to the terminal for the first supply potential;
    (l) the collector of said first transistor of said fifth transistor pair being connected to the base of one of said transistors of said fourth transistor pair;
    (m) the collector of said second transistor of said fifth transistor pair being connected to the terminal for the second supply potential; and
    (n) the base of one of said transistors of said fifth transistor pair being a terminal for an input signal, and the base of the other of said transistors of said fifth transistor pair being a terminal for a reference signal.

2. The memory element according to claim 1, wherein the reference signals are fixed potentials.

3. The memory element according to claim 1, wherein the reference signals at said second transistors of said first and second transistor pairs are input signals being complementary to the input signals at the bases of said first transistors of said first and second transistor pairs.

4. The memory element according to claim 3, wherein the base of said second transistor of said third transistor pair is connected to the collector of said first transistor of said third transistor pair.

5. The memory element according to claim 1, wherein the reference signal at said fifth transistor pair is a signal complementary to the input signal at said fifth transistor pair.

* * * * *